(12) United States Patent
Chou et al.

(10) Patent No.: US 7,399,399 B2
(45) Date of Patent: Jul. 15, 2008

(54) METHOD FOR MANUFACTURING SEMICONDUCTOR PACKAGE SUBSTRATE

(75) Inventors: E-Tung Chou, Hsin-chu (TW); Che-Wei Hsu, Hsin-chu (TW); Tzu-Sheng Tseng, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 194 days.

(21) Appl. No.: 11/523,337

(22) Filed: Sep. 18, 2006

(65) Prior Publication Data

US 2007/0087473 A1    Apr. 19, 2007

(30) Foreign Application Priority Data

Oct. 17, 2005    (TW) ............... 94136112 A

(51) Int. Cl.
    *C25D 5/02*    (2006.01)
(52) U.S. Cl. ............... 205/126; 29/846; 29/847; 427/96.1; 427/97.1; 427/97.3; 427/97.4; 427/97.5
(58) Field of Classification Search ............... None
    See application file for complete search history.

(56) References Cited

U.S. PATENT DOCUMENTS

| | | | |
|---|---|---|---|
| 6,214,525 B1 * | 4/2001 | Boyko et al. ............... | 430/313 |
| 7,216,424 B2 * | 5/2007 | Wang ............... | 29/843 |
| 2004/0080031 A1 * | 4/2004 | Huang et al. ............... | 257/678 |
| 2004/0134682 A1 * | 7/2004 | En et al. ............... | 174/258 |
| 2005/0253284 A1 * | 11/2005 | Wang et al. ............... | 257/787 |
| 2006/0006422 A1 * | 1/2006 | Chu et al. ............... | 257/222 |
| 2006/0134888 A1 * | 6/2006 | Wu et al. ............... | 438/465 |

* cited by examiner

*Primary Examiner*—David E Graybill
(74) *Attorney, Agent, or Firm*—Sawyer Law Group, LLP

(57) ABSTRACT

A method for manufacturing a semiconductor package is proposed. A circuit board with a circuit layer on at least one surface thereof is provided. The circuit board has at least one free area, and the circuit layer has a plurality of electrically connecting pads distributed on the periphery of the free area. A metal protecting layer is plated on the electrically connecting pads by non-plating line. The free area is removed, to form a cavity penetrating the circuit board. The present invention prevents burrs which may otherwise form on the periphery of a cavity, to increase the yield and throughput.

6 Claims, 4 Drawing Sheets

METHOD FOR MANUFACTURING SEMICONDUCTOR PACKAGE SUBSTRATE

CROSS-REFERENCE TO RELATED APPLICATION

This application claims benefit under 35 USC 119 to Taiwan Application No. 094136112, filed Oct. 17, 2005.

FIELD OF THE INVENTION

The present invention relates to a method for manufacturing a semiconductor package substrate, and more particularly, to a method for manufacturing a window ball grid array (window BGA) semiconductor package substrate.

BACKGROUND OF THE INVENTION

Effective in reducing volume of BGA package products, a window ball grid array (window BGA) package is in line with the electronic product trend toward miniaturization. A window BGA package has the following characteristics: first, installed in a substrate for carrying a semiconductor chip is at least one cavity penetrating the substrate, and as a result, not only is the semiconductor chip mounted on the upper substrate surface in a face down manner, but one end of the cavity is closed; second, solder wires made from a certain material, for example, gold, are inserted into the cavity to electrically connect the semiconductor chip and electrically connecting pads beneath the substrate; thirdly, the semiconductor chip is electrically connected to an external printed circuit board by means of solder balls installed on the lower substrate surface and functioning as input and output leads; fourthly, the electrically connecting pads, installed on the lower surface of the substrate and connected to the semiconductor chip by the solder wires, are distributed on the periphery of the cavity; fifthly, a nickel/gold layer is formed on the surfaces of the electrically connecting pads such that during a wire bonding operation electrical coupling of the gold wires and the electrically connecting pads is achieved because both of them are fabricated from the same metal, i.e. gold; lastly, given the aforesaid technology, extrinsically induced oxidation of the body of the electrically connecting pads, typically oxidation of copper, is prevented.

Manufacturers nowadays usually form a nickel/gold metal protecting layer on the aforesaid electrically connecting pads, using an electroplating process. Correspondingly, it is necessary to lay a plurality of plating wires in a substrate, wherein the plating wires are connected to the electrically connecting pads such that during the electroplating process the plating wires function as electrical conduction paths, to lay a nickel/gold metal protecting layer on the electrically connecting pads by electroplating. Afterward, the substrate on which the nickel/gold process is performed and finalized proceeds to a router process whereby, not only is the electrical connection between the plating wires and the electrically connecting pads severed, but a cavity is formed in the circuit board.

Referring to FIGS. 1A through 1C, which are flow diagrams showing a window BGA package circuit board undergoing a nickel/gold process and an opening process successively according to the conventional technology.

Referring to FIGS. 1A, 1B, wherein a circuit board 1 with a circuit layer 11 formed on at least one surface thereof is prepared. The circuit board 1 has already finished undergoing a pre-process. At least one selected zone S (as shown in FIG. 1B) intended for subsequent formation of an opening is defined on the circuit board 1. The circuit layer 11 comprises a plurality of electrically connecting pads 110 and plating wires 111 connected to the electrically connecting pads 110. A metal protecting layer 112 is formed to coat both the electrically connecting pads 110 and the plating wires 111. A solder mask layer 113 is further formed on the surfaces of the circuit board 1; formed in the solder mask layer 113 is an opening 113a to expose the electrically connecting pads 110 and the plating wires 111, both covered in the metal protecting layer 112.

Referring to FIG. 1C, a router process is carried out, using a milling cutter, wherein the periphery of the selected zone S is cut with the milling cutter to achieve two purposes. First, the electrical connection between the plating wires 111 and the electrically connecting pads 110 is severed, to build an open circuit. Second, the selected zone S is removed, and a thru-hole-like cavity 12 is formed in the circuit board, to fabricate a window BGA package circuit board 1'.

Since both the plating wires 111 and the metal protecting layer 112 are made from ductile, malleable materials, burrs (symbol b) appear on the periphery of the cavity 12 in the window BGA package circuit board (as shown in FIG. 1C) when the ductile, malleable metal protecting layer material is pulled out with a milling cutter in the course of cavity 12 cutting and forming.

Although some manufacturers attempted to solve the aforesaid problem with burrs by cutting them, using milling cutters exclusively used in a router process, their endeavors prove ineffective, as the burrs survive the cutting process. Furthermore, as regards the fabrication process, its yield and throughput are low, due to the ineffective router process which, in turn, occurs because window slot pitches remain wide.

Accordingly, an issue that currently needs urgent solution involves overcoming the drawbacks of the aforementioned prior art for manufacturing semiconductor package circuit boards, that is, low yield and low throughput attributable to the burrs produced in the course of the cutting of plating wires with milling cutters.

SUMMARY OF THE INVENTION

Accordingly, to solve the drawbacks of the aforementioned conventional technology, it is a primary objective of the present invention to provide a method for manufacturing a semiconductor package substrate while eliminating burrs and enhancing the yield.

In order to achieve the above and other objectives, the present invention provides a method for manufacturing a semiconductor package substrate, comprising the following: providing a circuit board with a circuit layer disposed on at least one surface thereof; providing the circuit board with at least one free area; providing the circuit layer with a plurality of electrically connecting pads distributed on the periphery of the free area; forming a conductive layer on the surfaces of said circuit board and said circuit layer thereon; forming a first resist layer on said conductive layer, and forming an opening on the surface of said first resist layer to expose said conductive layer overlaying said electrically connecting pads of said circuit layer and said free area; removing said conductive layer exposed through said opening of said first resist layer to expose said electrically connecting pads and said free area; forming a second resist layer on said first resist layer, said electrically connecting pads and said free area, forming an opening in said second resist layer to expose said electrically connecting pads and said free area, and covering remnants exposed on the periphery of said opening of said first resist layer as a result of the removal of said conductive layer;

electroplating a metal protecting layer on the surfaces of said electrically connecting pads exposed in said opening of said second resist layer; removing said first and second resist layers and said conductive layer clad in said first resist layer; and removing said free area to form a cavity penetrating said circuit board.

The method for manufacturing a semiconductor package substrate according to the present invention further comprises forming a solder mask layer on the surfaces of the circuit board, and forming an opening in the solder mask layer to expose the electrically connecting pads on which the metal protecting layer has been formed.

Compared with the known technology, the method for manufacturing a semiconductor package substrate according to the present invention involves applying a non-plating line process in the formation a metal protecting layer on the electrically connecting pads of a circuit board, then directly cutting a free area of the circuit board by means of machine cutters like a milling cutter, and eventually removing the free area to form a thru-hole-like cavity in the circuit board. The present invention absolves a machine cutter from cutting any plating wires typically formed in the free area in accordance with the conventional technology, thus in the present invention burrs are unlikely to appear on the periphery of a cavity as a result of the cutting process of the machine cutter. Accordingly, production yield increases.

DETAILED DESCRIPTION OF THE PREFERRED EMBODIMENTS

The following specific embodiment is provided to illustrate the present invention. Others skilled in the art can readily gain an insight into other advantages and features of the present invention based on the contents disclosed in this specification. The present invention can also be performed or applied in accordance with other different embodiments. Various modifications and changes based on different viewpoints and applications yet still within the scope of the present invention can be made in the details of the specification.

Referring to FIGS. 2A through 2J are flow diagrams illustrating the method for manufacturing a semiconductor package substrate according to the present invention. Points needing attention are as follows: all the figures are simple schematic diagrams intended to schematically describe the manufacturing process for the package substrate of the present invention. The figures, however, only show the components relevant to the present invention but do not show their practical appearance. In practice, the quantity, shape and size of the components are selectively designed, and the layout of the components may be even more intricate.

Figure 1A:
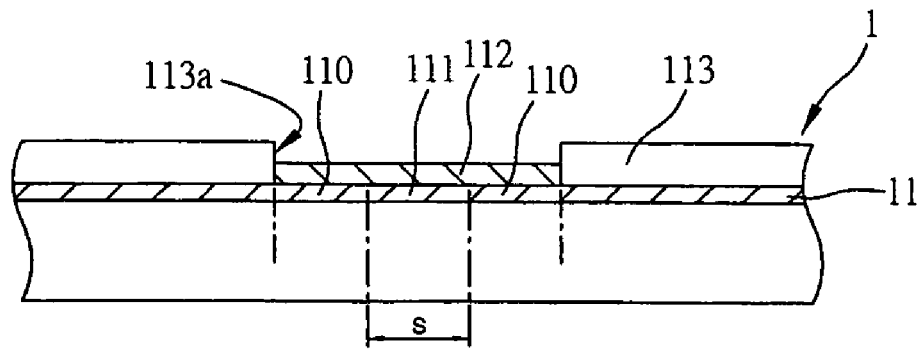
FIGS. 1A through 1C are flow diagrams illustrating the method for manufacturing a window BGA package circuit board according to the conventional technology.
Figure 1B:
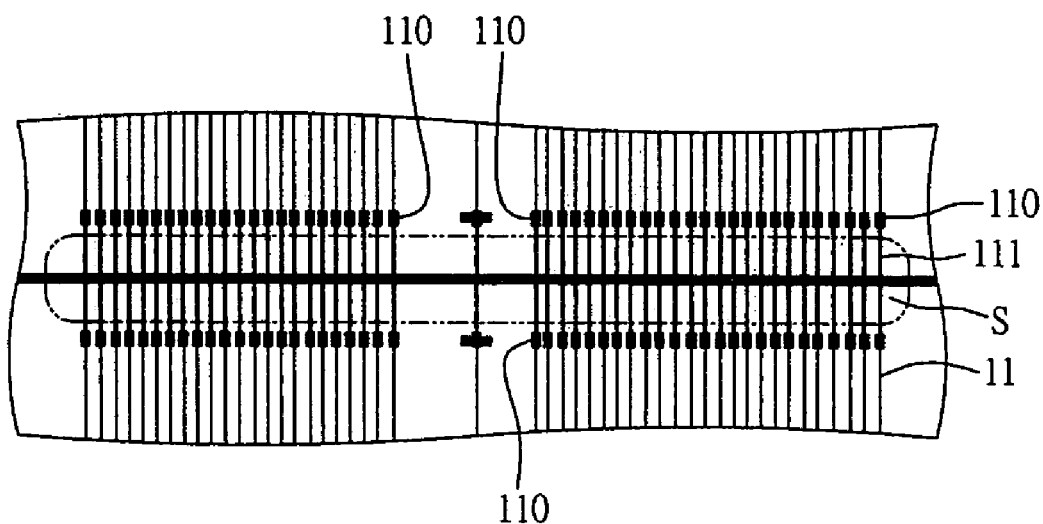
Figure 1C:
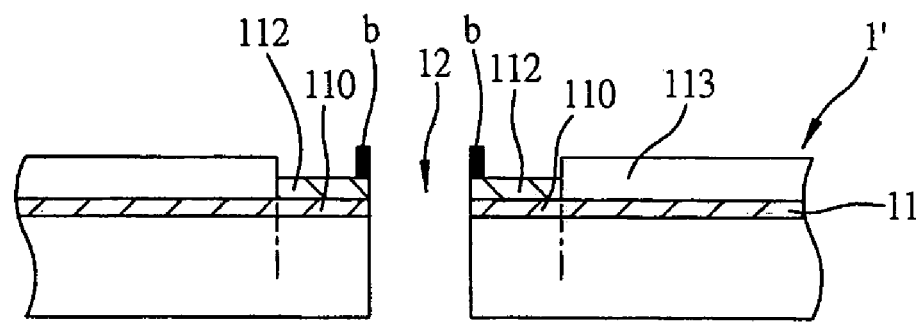
Figure 2A:
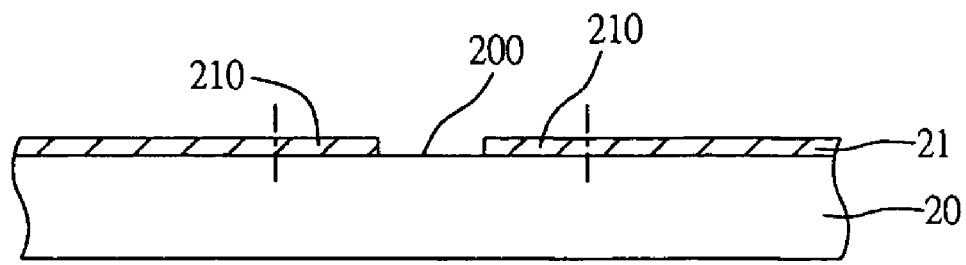
FIGS. 2A through 2J are flow diagrams illustrating the method for manufacturing a semiconductor package substrate according to the present invention.
Figure 2B:
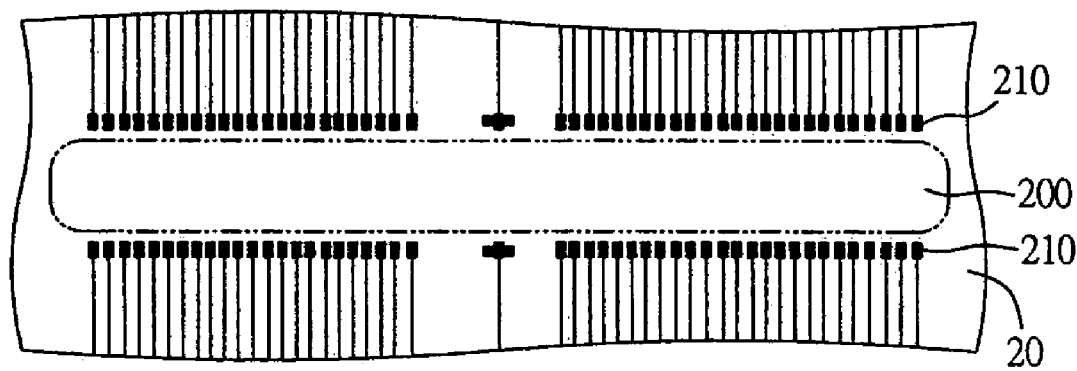

As shown in FIGS. 2A and 2B, the present invention provides a circuit board 20 with a circuit layer 21 disposed on at least one surface thereof, wherein the circuit board 20 is a circuit board having a layout process done. Installed in the circuit board 20 is at least one free area 200 intended for subsequent penetration through the circuit board 20. The circuit layer 21 is provided with a plurality of electrically connecting pads 210, such as fingers. As shown in FIG. 2B, the electrically connecting pads 210 are distributed on the periphery of the free area 200.

Figure 2C:
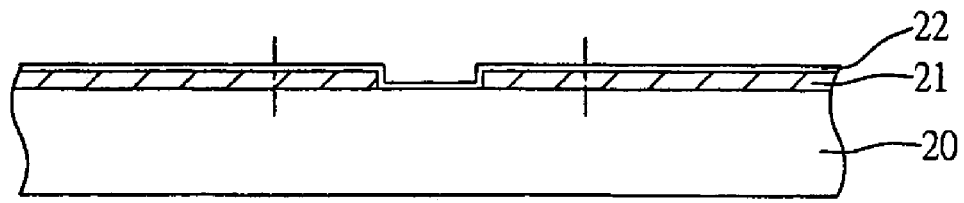

As shown in FIG. 2C, a non-plating line (NPL) process is performed on the circuit board 20, to form a conductive layer 22 on the surfaces of the circuit board 20 and the circuit layer 21 thereon.

Figure 2D:
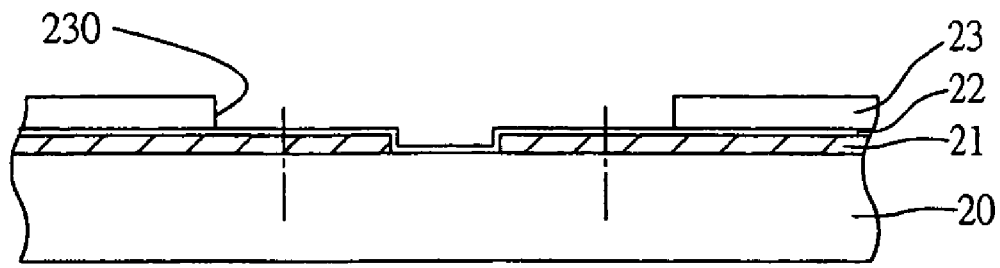

As shown in FIG. 2D, a first resist layer 23 is formed on the conductive layer 22, and an opening 230 is formed on the surface of the first resist layer 23 to expose the conductive layer 22 overlaying the electrically connecting pads 210 of the circuit layer 21 and the free area 200.

Figure 2E:
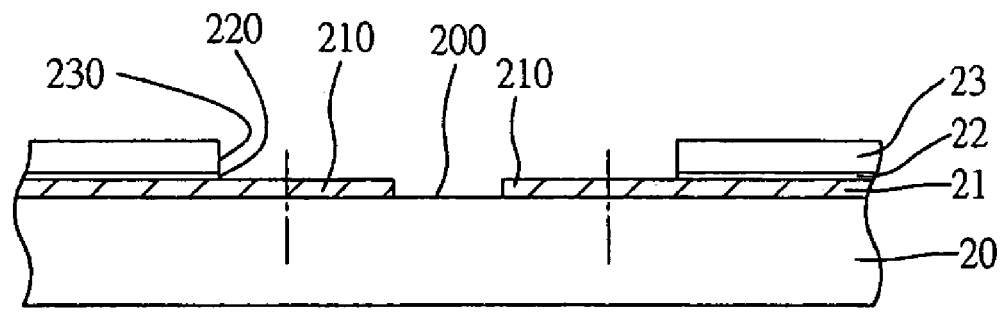

As shown in FIG. 2E, the conductive layer 22 exposed through the opening 230 of the first resist layer 23 is removed to expose the electrically connecting pads 210 and the free area 200.

Figure 2F:
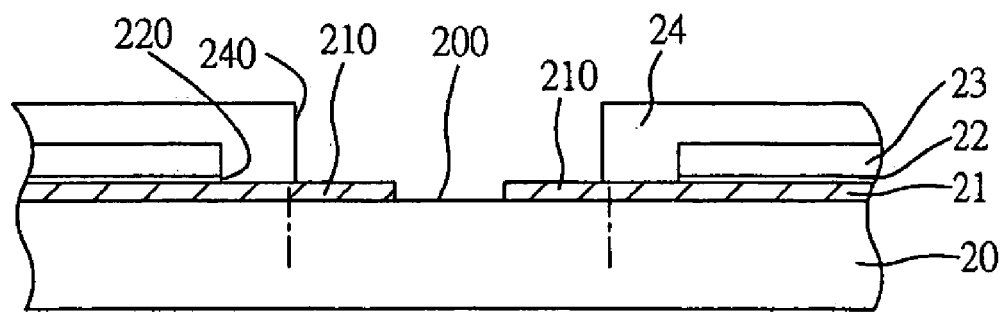

As shown in FIG. 2F, a second resist layer 24 is formed on the first resist layer 23, the electrically connecting pads 210 and the free area 200 respectively, whereas an opening 240 is formed in the second resist layer 24 by a pattern process to expose the electrically connecting pads 210 and the free area 200, and eventually remnants exposed on the periphery of the opening 230 of the first resist layer 23 as a result of the removal of the conductive layer 22 is covered.

Figure 2G:
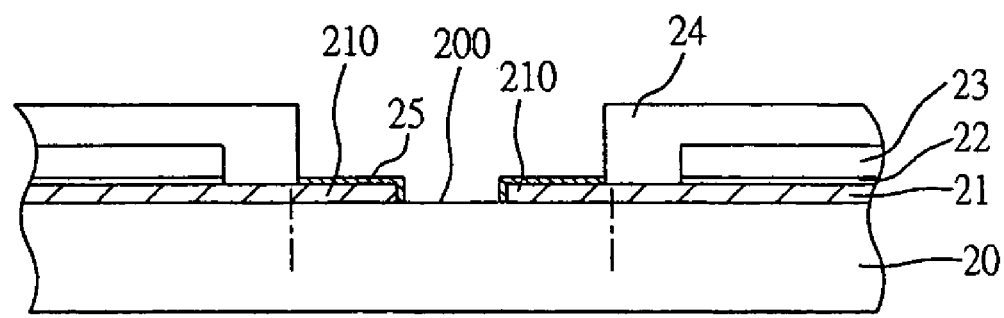

As shown in FIG. 2G, with the contact between the conductive layer 22 and the circuit layer 21 functioning as electrical conduction paths of plating, the electrically connecting pads 210 exposed in the opening 240 of the second resist layer 24 are coated with a metal protecting layer 25 by plating, wherein the metal protecting layer 25 is a multilaminar layer fabricated from a metal, and a combination of metals, selected from the group consisting of lead, tin, silver, copper, gold, bismuth, antimony, zinc, nickel, zirconium, magnesium, indium, tellurium, and gallium.

Figure 2H:
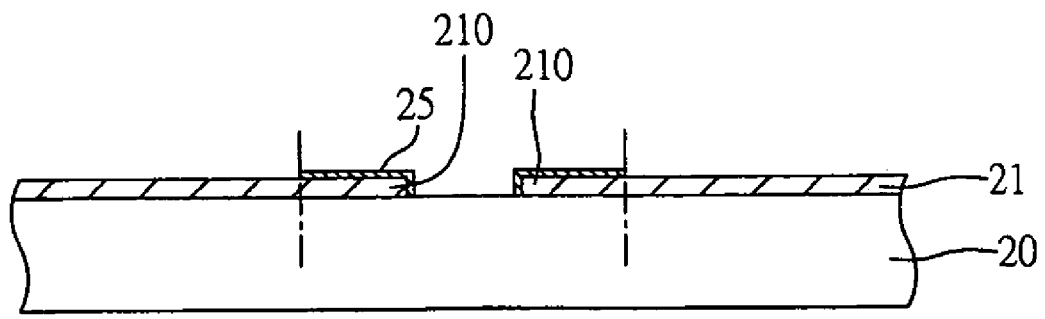

As shown in FIG. 2H, the first and second resist layers 23, 24 and the conductive layer 22 clad in the first resist layer 23 are removed respectively.

Figure 2I:
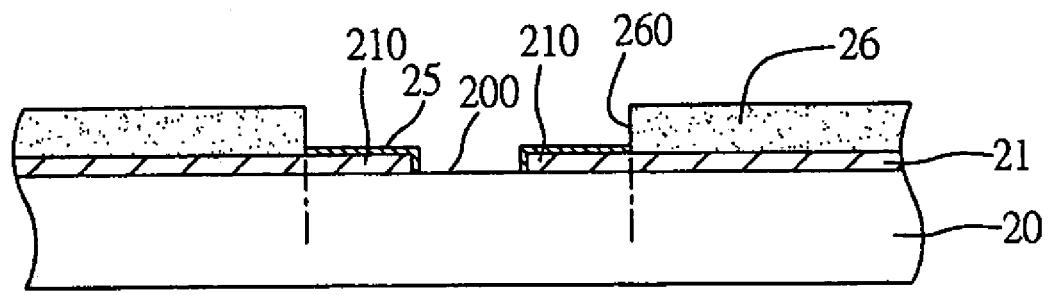

As shown in FIG. 2I, an insulator protecting layer 26, such as a solder mask layer, is formed on the surface of the circuit board 20 equipped with the circuit layer 21, and an opening 260 is formed in the insulator protecting layer 26 by a pattern process, in order to expose the free area 200 and the metal protecting layer 25 covering the electrically connecting pads 210 of the circuit layer 21.

Figure 2J:
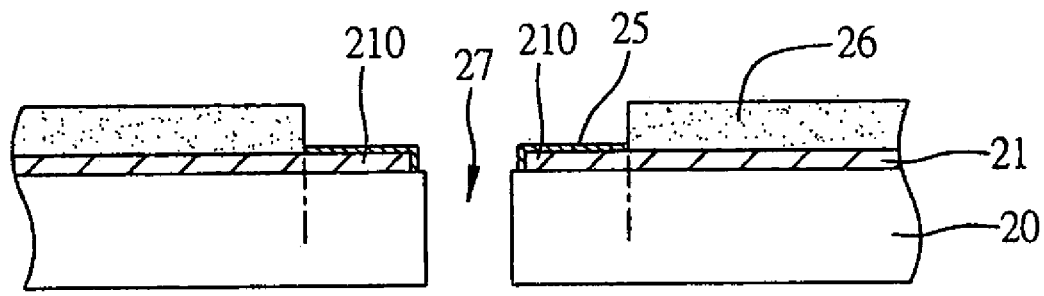

As shown in FIG. 2J, eventually, the free area 200 is removed with a machine cutter, such as a milling cutter, to form a cavity 27 penetrating the circuit board 20 in order to form a semiconductor package substrate.

In the present embodiment, the electrically connecting pads 210 disposed on the periphery of the free area 200 are coated with the metal protecting layer 25, then the free area 200 is removed from the circuit board 20 by means of machine cutters, such as a milling cutter, in order to form a cavity 27, thus sparing the plating wires typically formed in the free area the direct cutting process which was otherwise performed according to the conventional technology. As a result, the present invention prevents the formation of burrs on the periphery of the cavity 27 which may otherwise occur once the cavity 27 is formed.

Afterward, at least one semiconductor chip is mounted on the semiconductor package substrate. The active surface of the chip is firmly affixed to the semiconductor package substrate, using an adhesive. A plurality of solder wires pass through the cavity of the package substrate to electrically connect the semiconductor chip and the electrically connecting pads on the package substrate. Then, both the semiconductor chip and the solder wires are covered with a package gel. Lastly, a plurality of solder balls are embedded in the package substrate side dotted with the electrically connecting pads, to electrically connect the semiconductor chip to the external circuit.

Compared with the known technology, the method for manufacturing a semiconductor package substrate according to the present invention involves applying a non-plating line process in the formation a metal protecting layer, for example, one made from nickel-gold, on the electrically connecting pads of a circuit board, then directly cutting a free area of the circuit board by means of machine cutters like a milling cutter, and eventually removing the free area to formed a thru-hole-like cavity in the circuit board. The present invention absolves a milling cutter from cutting any plating wires typically formed in the free area, which is otherwise the case in accordance with the conventional technology, thus the metal protecting layer material is unlikely to be pulled out with the milling cutter during the cutting process, and, as a result, The aforesaid embodiment merely serves to illustrate the principles and functions of the present invention. They should not be construed as to limit the scope of the present invention in any way. It will be apparent to those skilled in the art that modifications and changes made in the aforesaid embodiment without departing from the spirit and the scope disclosed by the present invention. Hence, legal protection for the present invention shall cover the appended claims.

What is claimed is:

1. A method for manufacturing a semiconductor package substrate, comprising:
   providing a circuit board having a circuit layer disposed on at least one surface thereof, wherein said circuit board having at least one free area, wherein said circuit layer having a plurality of electrically connecting pads distributed on the periphery of said free area;
   forming a conductive layer on the surfaces of said circuit board and said circuit layer thereon;
   forming a first resist layer on said conductive layer, and forming an opening on the surface of said first resist layer to expose said conductive layer overlaying said electrically connecting pads of said circuit layer and said free area;
   removing said conductive layer exposed through said opening of said first resist layer to expose said electrically connecting pads and said free area;
   forming a second resist layer on said first resist layer, said electrically connecting pads and said free area respectively, forming an opening in said second resist layer to expose said electrically connecting pads and said free area, and covering remnants exposed on the periphery of said opening of said first resist layer as a result of the removal of said conductive layer;
   electroplating a metal protecting layer on the surfaces of said electrically connecting pads exposed in said opening of said second resist layer;
   removing said first and second resist layers and said conductive layer clad in said first resist layer; and
   removing said free area to form a cavity penetrating said circuit board.

2. The method for manufacturing a semiconductor package substrate of claim 1, further comprising forming a solder mask layer on the surfaces of said circuit board, and forming an opening in said solder mask layer to expose said electrically connecting pads on which said metal protecting layer has been formed.

3. The method for manufacturing a semiconductor package substrate of claim 1, wherein said electrically connecting pads are fingers.

4. The method for manufacturing a semiconductor package substrate of claim 1, wherein said metal protecting layer is a multilaminar layer fabricated from a metal, and a combination of metals, selected from the group consisting of lead, tin, silver, copper, gold, bismuth, antimony, zinc, nickel, zirconium, magnesium, indium, tellurium, and gallium.

5. The method for manufacturing a semiconductor package substrate of claim 1, wherein said free area being cut and removed with a machine cutter to form said cavity penetrating said circuit board.

6. The method for manufacturing a semiconductor package substrate of claim 1, wherein said machine cutter is a milling cutter.

* * * * *